(12) United States Patent
Braunisch et al.

(10) Patent No.: US 7,989,946 B2
(45) Date of Patent: Aug. 2, 2011

(54) MULTIMODE SIGNALING ON DECOUPLED INPUT/OUTPUT AND POWER CHANNELS

(75) Inventors: Henning Braunisch, Chandler, AZ (US); Kemal Aygun, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 12/882,322

(22) Filed: Sep. 15, 2010

(65) Prior Publication Data

US 2011/0019386 A1 Jan. 27, 2011

Related U.S. Application Data

(62) Division of application No. 12/217,294, filed on Jul. 2, 2008, now Pat. No. 7,816,779.

(51) Int. Cl.
*H01L 23/48* (2006.01)

(52) U.S. Cl. ........................................ 257/693; 257/691

(58) Field of Classification Search .................. 257/691, 257/701, 693; 493/330, 329, 498, 517, 525, 493/607.14
See application file for complete search history.

(56) References Cited

U.S. PATENT DOCUMENTS

| | | | |
|---|---|---|---|
| 6,881,096 B2 * | 4/2005 | Brown et al. | 439/620.01 |
| 6,910,812 B2 * | 6/2005 | Pommer et al. | 385/92 |
| 2005/0058408 A1 * | 3/2005 | Colgan et al. | 385/89 |
| 2007/0010132 A1 * | 1/2007 | Nelson et al. | 439/577 |
| 2010/0215317 A1 * | 8/2010 | Rolston et al. | 385/53 |

* cited by examiner

*Primary Examiner* — S. V Clark
(74) *Attorney, Agent, or Firm* — Trop, Pruner & Hu, P.C.

(57) ABSTRACT

A multimode system with at least two end points may include a multimode signaling path that, in some embodiments, is a multimode cable or a multimode board and is pluggably connectable to packages at each end point. Each end point may include a processor die package coupled to a socket. The socket may also receive a connector that couples the cable to the package. Power supply signals and input/output signals may be decoupled at each end point.

7 Claims, 1 Drawing Sheet

MULTIMODE SIGNALING ON DECOUPLED INPUT/OUTPUT AND POWER CHANNELS

CROSS-REFERENCE TO RELATED APPLICATIONS

This application is a divisional of U.S. patent application Ser. No. 12/217,294, filed on Jul. 2, 2008 now U.S. Pat. No. 7,816,799.

BACKGROUND

This relates generally to systems that use multimode signaling.

Conventional signaling is either single ended or differential signaling. In single ended signaling, one wire carries one signal. The wires must be spaced to avoid cross-talk. In differential signaling, two wires carry one signal, but wire pairs must be spaced apart to avoid differential cross-talk.

In multimode signaling, the number of the wires and the number of signals may be equal or there may be an extra conductor or two to act as ground. Multimode signaling is defined as the use of linearly independent modes to reduce cross-talk. In multimode signaling, ideally cross-talk is avoided regardless of the spacing between the conductors.

DETAILED DESCRIPTION

In accordance with some embodiments of the present invention, multimode signaling may be used between two end points, each end point including a die such as a processor. The two end points are connected by a multimode signaling path. The multimode signaling path may be implemented on suitable media such as a multimode cable or multimode board or a combination thereof. As used herein, a "multimode board" is any set of conductors capable of carrying multimode signals. As used herein, a "multimode cable" is any set of conductors capable of carrying multimode signals and exhibiting mechanical flexibility.

At each end point of the signaling path, there is a connector system which separates power signals and input/output signals. In other words, input/output signals do not follow the same path as the power signals. The multimode signaling may only be used in some cases for the input/output signals and, thus, the connections designed for input/output signaling may be tailored for input/output signals and are different from connections used for power signals.

In addition, at least one end point is pluggable at least one location along the input/output signal path between dies. By "pluggable," it is intended to refer to a friction connection between two electrical components that enables repeated separation and reconnection.

In the multimode signaling, the number and size of discontinuities are important. A discontinuity is a change in a characteristic of the conductor that causes mode mixing. In general, it is desirable that, to the greatest possible extent, multimode signals travel over what may be described as straight-shot connections. It is desirable that any single discontinuity be less than minus 12 decibels over the entire frequency range of interest. The frequency range of interest typically includes but is not limited to the fundamental frequency of the signal transmission. For example, for multimode signaling operating at a signaling rate of 10 gigatransfers per second the fundamental frequency is 5 gigahertz.

Figure 1:
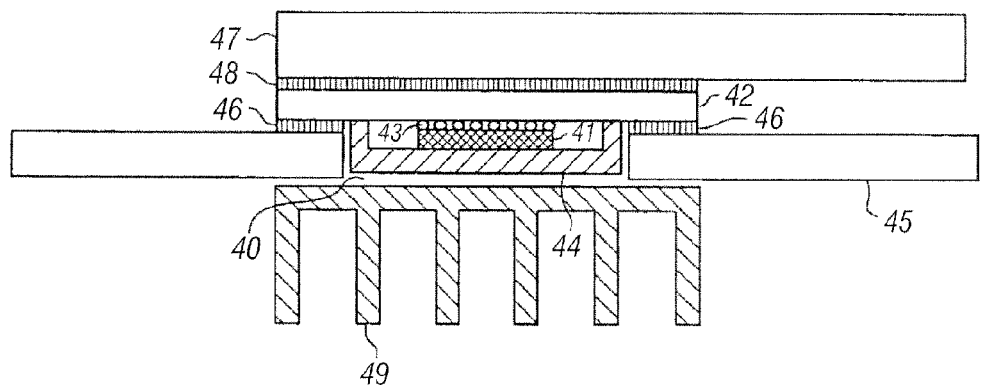
FIG. 1 is a cross-section of one embodiment of the present invention.

Referring to FIG. 1, one end point of a multimode signaling system is depicted. In some embodiments, a corresponding end point may be provided on the other end of the multimode path 45 in the form of a multimode board. However, the end points may be configured differently.

The multimode path 45 may include a plurality of conductors for carrying input/output signals and may include one or more additional conductors for ground.

Power signals and input/output signals are decoupled because the power supply comes through a voltage regulator module 47. The voltage regulator module 47 plugs through a connector 48 to a package substrate 42.

The connector 48 may include a land grid or pin grid array, solder balls, or any connection. There is no need for the connector 48 to be implemented in a pluggable fashion.

The substrate 42 then connects an integrated circuit die 41, conventionally a processor, such as a micro-processor, microcontroller, or digital signal processor. This connection is made via a connector 43. In the embodiment shown in FIG. 1, the connector 43 is a controlled-collapse chip connection (C4), but any other connection may be used, including both pluggable and non-pluggable connections.

In one embodiment, an integrated heat spreader 44 surrounds the integrated circuit 41 to dissipate heat through a heat sink 49. The heat sink 49 may be coupled to the integrated heat spreader 44 by a thermal interface material 40.

The multimode input/output signal connections come in separately from power signal connections. In particular, the multimode input/output signals from the path 45 pass upwardly through the connector 46 to the package substrate 42 and then downwardly through the connector 43 to the integrated circuit 41.

The connector 46 is advantageously a pluggable connector such as a land grid array type connector using pins that touch down on mating lands. For example, in one embodiment, the pins may be present on the connector 46 and may be soldered to pads on multimode path 45 and be received by lands on package substrate 42. However, the opposite arrangement may also be utilized.

In general, it is desirable that the connector 46 be as low profile as possible and, in particular, it is desirable that any pins be on the order of one millimeter or less. Given that the signals move horizontally through the path 45, it is desirable to reduce, to the greatest possible extent, the vertical excursions of the signal paths en route to the integrated circuit 41. Thus, it is desirable that the connector 46 be low profile, that the passages through the substrate 42 be low profile, and that the connector 43 be as low profile as feasible. In general, it is desired that no discontinuity be presented along the signal path for multimode input/output signals that creates a return loss of greater than −12 decibels over the entire frequency range of interest.

In the embodiment shown in FIG. 1, the package substrate 42 is coupled, on its die side, to the multimode path 45. Thus, in some embodiments, the structure shown in FIG. 1 may be referred to as a die-down, power-up package. It is a die-down in the sense that the die is upside down with respect to conventional flip chip packages mounted on standard motherboards and it is power-up in the sense that power comes in vertically from above. In effect, the multimode signals come in horizontally more or less from the side. Die side and signal land side coincide and are the bottom side of the package.

The die 41 is bonded to the land side of the package and the signals are routed on the bottom surface layer directly out to the board, through a high-speed interface, such as a high-speed socket, implementing the connector 46, not subject to power delivery restrictions usually imposed on conventional sockets.

Figure 2:
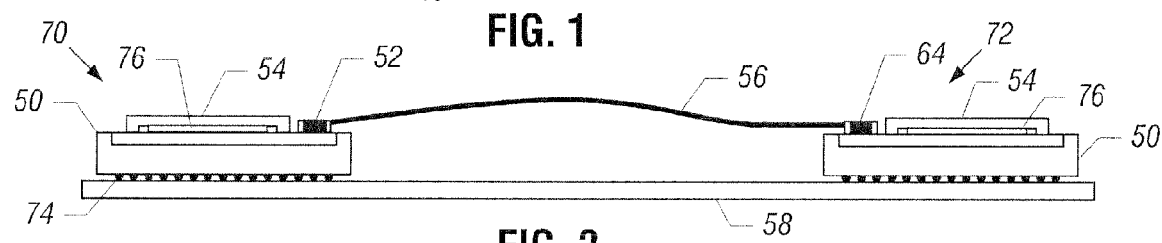
FIG. 2 is a cross-section of another embodiment of the present invention.

Referring to FIG. 2, another embodiment in which multimode input/output signals and power signals are decoupled is depicted. In this case, two end points 70 and 72 are connected by a multimode cable 56.

The multimode cable 56 may include a plurality of conductors for carrying input/output signals and may include one or more additional conductors for ground.

Each end point 70 or 72 may be identical, in one embodiment, including an integrated heat spreader 54, which may be coupled to a heat sink (not shown), a socket 50, which may be secured by solder balls 74 to a substrate 58, such as a printed circuit board, and an integrated circuit die package 76 plugged into the socket 50, such as a land grid array connector. For example, in a land grid array connector, pins on the socket may be received by pads on the package 76. While the two end points 70 and 72 are shown as being connected by the printed circuit board 58, in some embodiments, they may be on separate printed circuit boards.

Again, the connector 52 connects the end point 70 to the multimode cable 56 and the connector 64 connects the end point 72 to the cable 56. The connectors 52 and 64 may be low profile, high speed connectors that reduce discontinuities to the greatest practical extent. For example, the discontinuities may be reduced so that the return losses are less than −12 decibels over the entire frequency range of interest.

At least one connection, in the embodiment shown in FIG. 2, is pluggable in the multimode input/output signal path. This means that the connector 52 may be pluggable into the end point 70 or the connector 64 may be pluggable into the end point 72. In this way, the system can be disconnected for repair, analysis, replacement, and upgrading, for example.

In some embodiments, as part of connector 52 or connector 64, conductive films, including isotropic and anisotropic conductive films, can be used that are pluggable.

In FIG. 2, power may be supplied separately from the multimode input/output signals that come in more or less horizontally through the cable 56. In one embodiment, pins on the socket 50 extend upwardly in land grid array arrangement to be received by lands on package 76.

Figure 3:
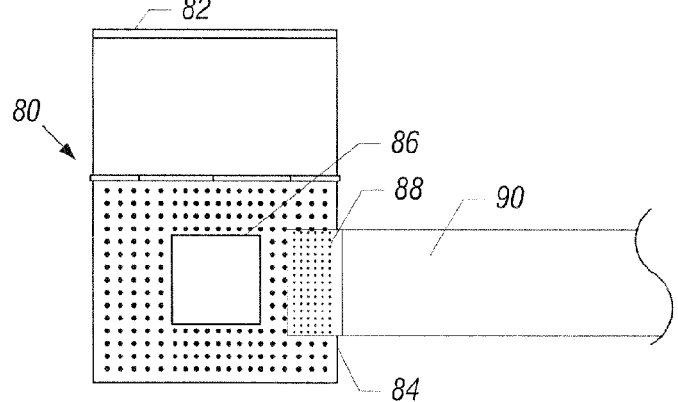
FIG. 3 is a top plan view of another embodiment of the present invention.

Referring to FIG. 3, in accordance with still another embodiment of the present invention, a socket 80 may have a hinged top 82 and a base 84 which is arranged, in one embodiment, in a land grid array pattern of upstanding pins. An opening 86 may be provided in the middle, even though this is not needed. A socket portion 88 is distinct from the rest of the base 84 and includes a cavity to receive a multimode input/output signal cable 90 and high-speed connector, which are shown already inserted into the socket portion 88. The configuration, shown in FIG. 3, may be referred to as a "split socket" since the same socket is used both for pins to connect a board to an integrated circuit die package (not shown) and pins for connection of the same package to a cable 90 that carries multimode signals.

Figure 4:
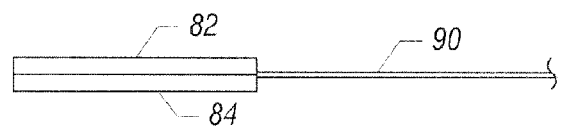
FIG. 4 is a side elevational view of the embodiment shown in FIG. 3.

Thus, turning to FIG. 4, the top 82 is closed and secured in position, with the integrated circuit die package (not shown) electrically mated to the socket base 84 and the cable 90 secured in the socket portion 88 and mated to the package. In one embodiment, the cable 90 is pluggably connected to the package. To remove the cable, all that is necessary is to open the top 82 which, in one embodiment, may be hingedly connected to the base 84, and unplug the cable connection.

In accordance with one embodiment of the present invention, coreless package substrates or plated-through-hole-less substrates, such as filled via core substrates, or coaxial plated-through-hole via substrates may be utilized. This may reduce vertical discontinuity for the portion of the multimode signaling path traversing the package and interconnecting the integrated circuit die and cable 90.

References throughout this specification to "one embodiment" or "an embodiment" mean that a particular feature, structure, or characteristic described in connection with the embodiment is included in at least one implementation encompassed within the present invention. Thus, appearances of the phrase "one embodiment" or "in an embodiment" are not necessarily referring to the same embodiment. Furthermore, the particular features, structures, or characteristics may be instituted in other suitable forms other than the particular embodiment illustrated and all such forms may be encompassed within the claims of the present application.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. An apparatus comprising:
   a first integrated circuit package including a processor and a socket, said package mounted in said socket;
   said processor coupled to a power supply terminal along a first path;
   a multimode cable to carry multimode input/output signals to and from said processor; and
   a connector on said package, coupled to said cable to supply said multimode input/output signals to said processor along a second path decoupled from said first path, said connector being a pluggable connector.

2. The apparatus of claim 1 including a second integrated circuit package coupled to said cable.

3. The apparatus of claim 1 wherein said socket mounts both said processor and said connector.

4. The apparatus of claim 1 wherein said socket is a split socket with a first socket region to receive the processor and a second socket region to receive the cable.

5. The apparatus of claim 4 wherein said processor has a coreless package substrate.

6. The apparatus of claim 1 wherein said connector includes pins having a height less than one millimeter.

7. The apparatus of claim 1 including a second package coupled to said cable such that said second path extends from said die in said first package to a die in said second package, said second path being free of discontinuities that create a return loss greater than −12 decibels over the entire frequency range of interest.

* * * * *